(12) United States Patent
Tsuei et al.

(10) Patent No.: US 7,220,020 B2
(45) Date of Patent: May 22, 2007

(54) LIGHT SOURCE DEVICE

(76) Inventors: Ji-Mei Tsuei, No. 13, Lane 142, Sec. 3, Chung-Hua Rd, Hsinchu (TW); Po-Hua Fang, 8F-2, No. 290, Kung-Uan Rd., Hsinchu (TW)

( * ) Notice: Subject to any disclaimer, the term of this patent is extended or adjusted under 35 U.S.C. 154(b) by 125 days.

(21) Appl. No.: 10/429,884

(22) Filed: May 6, 2003

(65) Prior Publication Data

US 2004/0223339 A1 Nov. 11, 2004

(51) Int. Cl.
*H05B 33/12* (2006.01)

(52) U.S. Cl. .................. 362/240; 362/238; 362/241; 362/249

(58) Field of Classification Search ........ 257/787; 362/223, 226; 313/512
See application file for complete search history.

(56) References Cited

U.S. PATENT DOCUMENTS

| | | | | |
|---|---|---|---|---|
| 4,254,453 A | * | 3/1981 | Mouyard et al. | 362/240 |
| 5,789,847 A | * | 8/1998 | Woodward et al. | 313/113 |
| 6,072,171 A | * | 6/2000 | Nakamura et al. | 250/216 |
| 6,806,583 B2 | * | 10/2004 | Koay et al. | 257/787 |
| 6,949,772 B2 | * | 9/2005 | Shimizu et al. | 257/99 |

* cited by examiner

*Primary Examiner*—Sandra O'Shea
*Assistant Examiner*—Anabel Ton
(74) *Attorney, Agent, or Firm*—Berkeley Law & Technology Group, LLP

(57) ABSTRACT

A light source device including light emitting elements is provided. The light source device includes a print circuit board having a plurality of recesses formed of truncated elliptical/or rectangular cones in a linear arrangement formed thereon, a plurality of light emitting elements and an emission-permeable window part disposed in each of the recesses. Each of the recesses has a flat bottom and an elliptical/or a rectangular cross section along the direction of the linear arrangement of the recesses in the print circuit board. One of the light emitting elements is disposed on the flat bottom of each of the recesses. Each light emitting element unit has an elongated illuminant surface along the longitudinal direction of the print circuit board due to the package thereof. The light emitting element units constitute a linear light source along this direction, and each light emitting element unit has an increased luminance flux along this direction.

8 Claims, 5 Drawing Sheets

LIGHT SOURCE DEVICE

BACKGROUND OF THE INVENTION

1. Field of the Invention

The present invention relates to a linear light source device, and more particularly to a linear light source device with SMD (surface mounting device) type light emitting elements.

2. Description of the Prior Art

The conventional image-capturing device, such as scanner, utilizes a light source device to provide a light source for illuminating an original upon performing a scanning action. A photoelectric detecting device detects the light penetrating or reflected from the original, and then transmitting to a personal computer to process the captured image information. In general, the light source device needs to provide a linear light source with steady light intensity. The intensity difference of each portion of the luminance area of the linear light source is required as small as possible to ensure the brightness of the captured image exact, not distorted. Especially for capturing a colorful image, the light source device needs to provide a white linear light source with steady light intensity in order that the brightness and color of the captured image and recovery of the original can attain high quality.

The light source utilized in the conventional image-capturing device includes cold cathode fluorescent lamp (CCFL) and light emitting diodes in a linear array. Referring to FIG. 1A and FIG. 1B, since the cold cathode fluorescent lamp 10 illuminates light 16 in all direction, a semi-cylindrical reflector 12 is used for concentrating the light 14 emitting from the cold cathode fluorescent lamp 10 and then illuminating upon the original. Moreover, before a scanning action begins, it is necessary to warm up the cold cathode fluorescent lamp 10 until the illumination of the cold cathode fluorescent lamp 10 attains steady state. The life time of the cold cathode fluorescent lamp 10 is about ten thousand hours, causing the limitation of the time of usage. The cold cathode fluorescent lamp 10 also has a low efficiency of illumination and large heat dissipation during illumination. The power is largely consumed. Thus, there are many drawbacks for using the cold cathode fluorescent lamp 10 as the light source.

The life time of the light emitting diode device is about one hundred thousand hours. The light source of the light emitting diode device can be used at once upon the image-capturing device is powered on. Thus, it is more convenient for using the light emitting diode device than the cold cathode fluorescent lamp 10. FIG. 2A to FIG. 2C show a conventional light source device 20 formed of SMD type light emitting diodes 22 arranged in a linear array parallel to the photo-sensor array of the image-capturing device. The conventional light source device 20 includes a print circuit board 21 having a plurality of recesses 23 formed of truncated circular cones in a linear arrangement thereon. Each of the recesses 23 has a flat bottom 24 for placing the light emitting diode 22. A transparent plastic sealing 25 is filled in the recess 23 to cover the light emitting diode 22. Referring to FIG. 2B, the light emitting diode 22 provides a circular illumination area outward from the print circuit board 21 due to the package thereof. When the light source device 20 is used as the linear light source of the image-capturing device, the illumination from the light emitting diode 22 along the transverse direction of the print circuit board 21 would be wasted. Therefore, it is necessary to place more light emitting diodes 22 on the print circuit board 21 so as to attain the required illumination. The manufacturing of the light source device 20 can not be cost down. The power supplied for the light emitting diodes 22 is also increased.

FIG. 3A to FIG. 3C show another conventional light source device 30 formed of SMD type light emitting diodes 32 arranged in a linear array parallel to the photo-sensor array of the image-capturing device. The conventional light source device 30 includes a print circuit board 31 having a plurality of recesses 33 formed of truncated square cones in a linear arrangement thereon. Each of the recesses 33 has a flat bottom 34 for placing the light emitting diode 22. A transparent plastic sealing 35 is filled in the recess 33 to cover the light emitting diode 32. Referring to FIG. 3B, the light emitting diode 32 provides a square illumination area outward from the print circuit board 31 due to the package thereof. When the light source device 30 is used as the linear light source of the image-capturing device, the illumination from the light emitting diode 32 along the transverse direction of the print circuit board 31 would be wasted. Therefore, the light source device 30 confronts the same problems mentioned above.

Accordingly, it is an intention to provide a light source device with SMD type light emitting elements, which can overcome the above drawbacks by changing the package thereof.

SUMMARY OF THE INVENTION

It is one objective of the present invention to provide a light source device, which is provided with surface mounting device (SMD) type light emitting elements to form a linear light source. By the package structure of the SMD type light emitting element, each of the light emitting elements has an elongated illuminant surface along the linear light source to increase the luminance flux thereof along this direction. The number of the light emitting elements thus can be decreased.

It is another objective of the present invention to provide a light source device, which can use less number of the light emitting elements to form the linear light source due to the package thereof, and still satisfy the required luminance flux. The cost down for manufacturing the present light source device can be attained.

It is still another objective of the present invention to provide a light source device, which can use less number of the light emitting elements to form the linear light source due to the package thereof. Thus, more power can be supplied to each of the light emitting elements to increase the luminance flux thereof, and the time for performing a scanning action can be shortened.

It is a further objective of the present invention to provide a light source device, which can use less number of the light emitting elements to form the linear light source, and thus more power can be supplied to each of the light emitting elements to increase the luminance flux thereof. Hence, the present light source device is suitable for a speedy image-capturing device.

In order to achieve the above objectives of this invention, the present invention provides a light source device, including a print circuit board having a plurality of recesses formed of truncated elliptical/rectangular cones in a linear arrangement formed thereon, a plurality of light emitting elements and an emission-permeable window part. Each of the recesses has a flat bottom and an elliptical/or a rectangular cross section along the direction of the linear arrangement of the recesses in the print circuit board. One of the light emitting elements is disposed on the flat bottom of each of the recesses and the emission-permeable window part is disposed in the recess above the light emitting element. Each light emitting element unit has an elongated illuminant surface along the longitudinal direction of the print circuit board due to the package thereof. The light emitting element units constitute a linear light source along this direction, and each light emitting element unit has an increased luminance flux along this direction. The number of the light emitting elements thus can be decreased and also satisfying the required luminance flux. Therefore, the cost down for manufacturing the present light source device is attained. Moreover, more power can be supplied to each of the light emitting elements to improve the luminance flux thereof to shorten the time for performing a scanning action.

BRIEF DESCRIPTION OF THE DRAWINGS

The objectives and features of the present invention as well as advantages thereof will become apparent from the following detailed description, considered in conjunction with the accompanying drawings.

DESCRIPTION OF THE PREFERRED EMBODIMENT

The present invention provides a light source device with SMD type light emitting elements, in which due to the package of each of the SMD type light emitting elements, the light emitting element provides an axis-unsymmetrical illuminating area, such as elongated illuminating area, so that the luminance flux of the light emitting element can be concentrated on the direction of a linear arrangement of the light emitting elements, and thus the luminance flux of each of the light emitting elements along this direction can be improved. The present light source device is suitable for used as a linear source, less number of light emitting elements is allowed and still satisfy the required illumination. The cost down for manufacturing the present light source device is obtained. Moreover, more power can be supplied to each of the light emitting elements to increase light intensity thereof, hence shortening the time for performing a scanning action. Besides, the present light source device is also suitable for a speedy scanning apparatus.

The present light source device will be described in detail in accordance with embodiments of the present invention in the following.

Figure 1A:
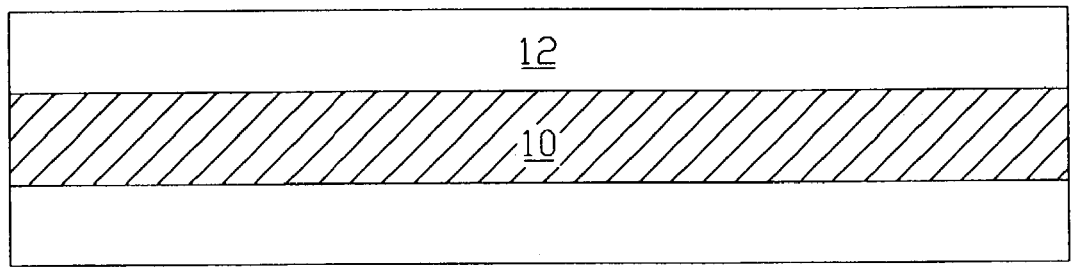
FIG. 1A is a schematic top view of a conventional light source device with a cold cathode fluorescent lamp (CCFL)
Figure 1B:
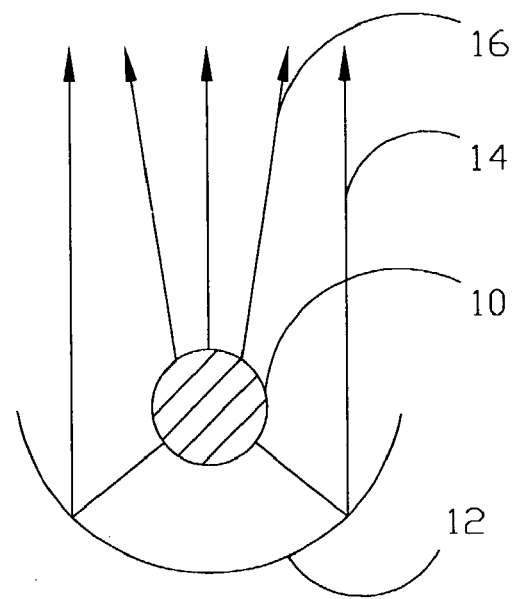
FIG. 1B is a schematic cross section view of the conventional light source device of FIG. 1A.
Figure 2A:
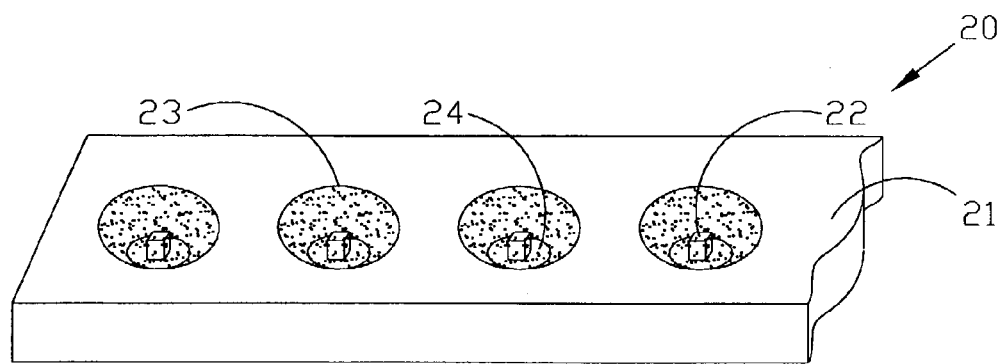
FIG. 2A is a schematic perspective view of a conventional linear light source device with SMD type light emitting diodes.
Figure 2B:
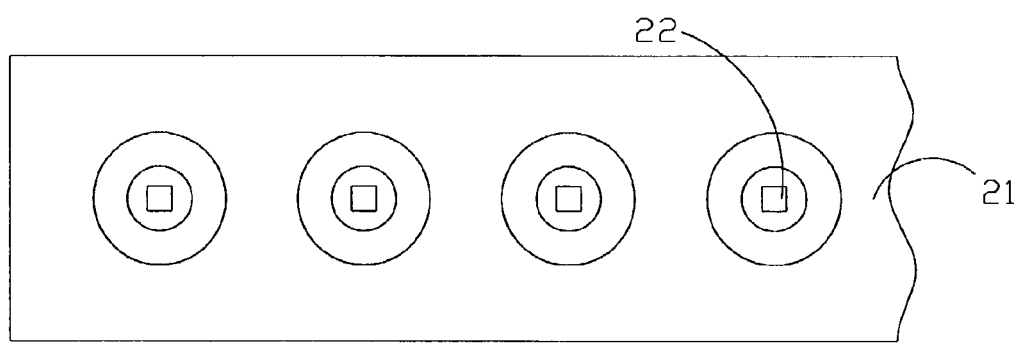
FIG. 2B is a schematic top view of the conventional linear light source device of FIG. 2A.
Figure 2C:
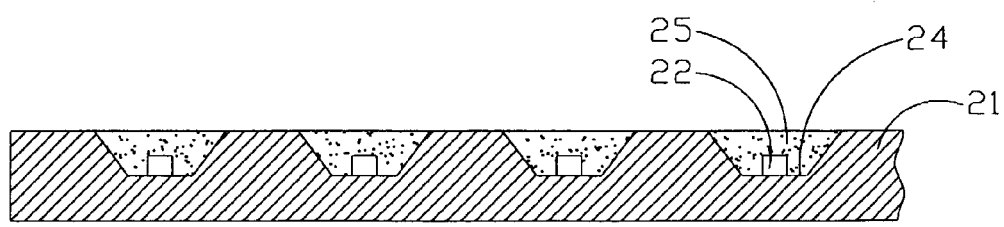
FIG. 2C is a schematic cross section view of the conventional linear light source device of FIG. 2A along the longitudinal direction thereof.
Figure 3A:
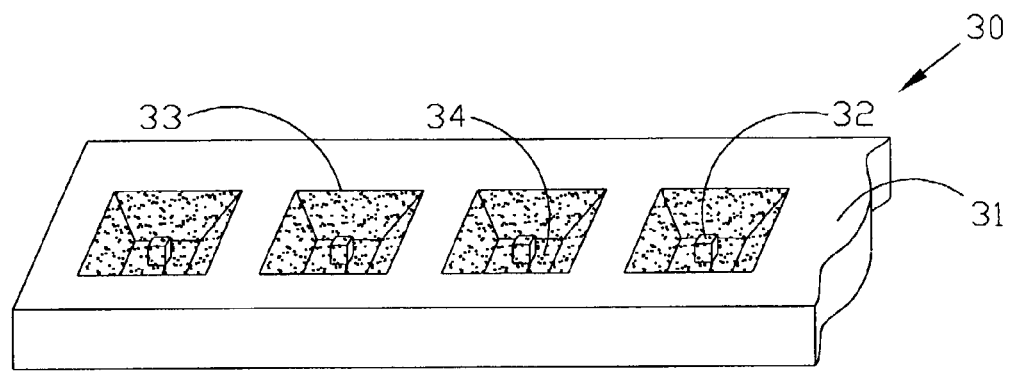
FIG. 3A is a schematic perspective view of another conventional linear light source with another SMD type light emitting diodes.
Figure 3B:
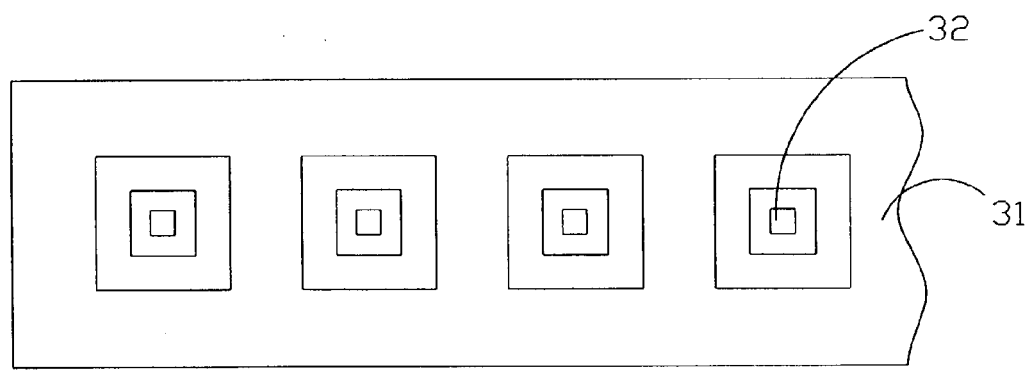
FIG. 3B is a schematic top view of the conventional linear light source of FIG. 3A.
Figure 3C:
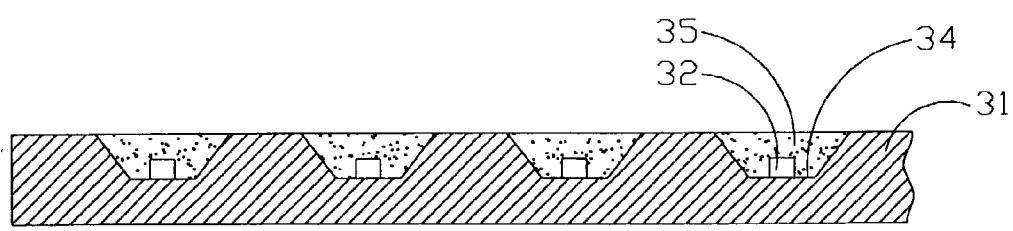
FIG. 3C is a schematic cross section view of the conventional linear light source of FIG. 3A along the longitudinal direction thereof.
Figure 4A:
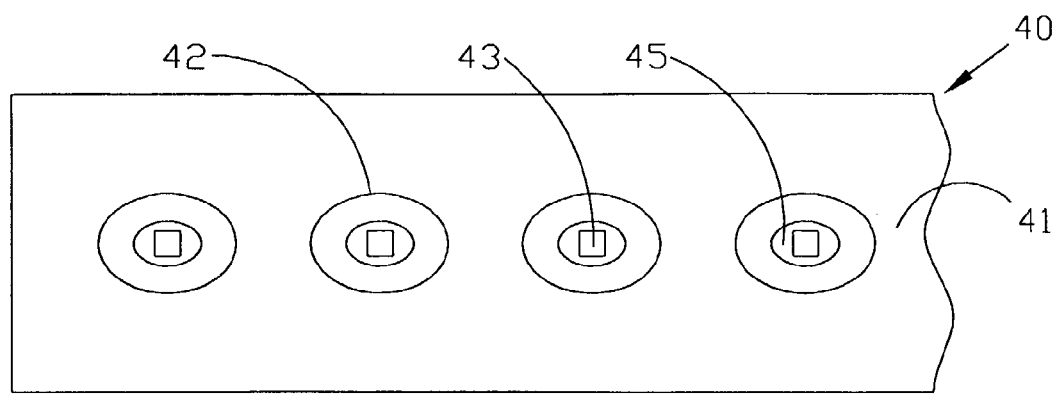
FIG. 4A is a schematic top view of a light source device according to a first embodiment of the present invention.
Figure 4B:
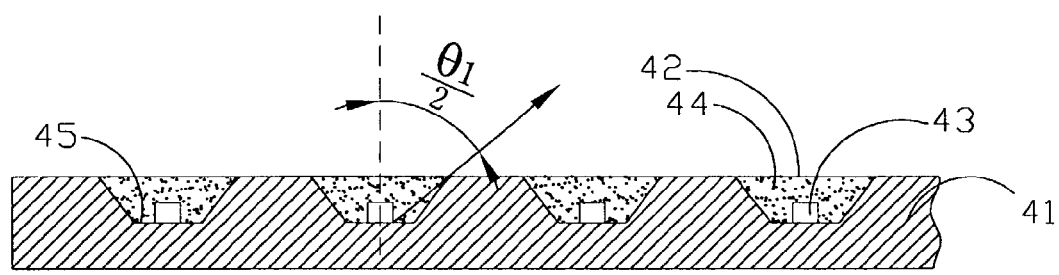
FIG. 4B is a schematic cross section view of the light source device of FIG. 4A along the longitudinal direction thereof.
Figure 4C:
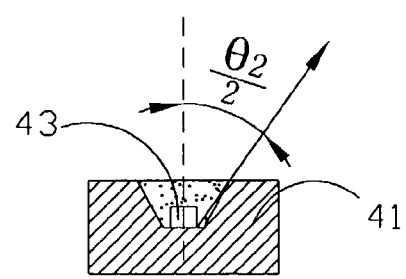
FIG. 4C is a schematic cross section view of the light source device of FIG. 4A along the transverse direction thereof.

FIG. 4A to FIG. 4C show a light source device 40 according to a first embodiment of the present invention. The light source device 40 includes a print circuit board 41 having a plurality of recesses 42 formed of truncated elliptical cones in a linear arrangement formed thereon, a plurality of light emitting elements 43 and emission-permeable window parts 44. Each of the recesses 42 has a flat bottom 45 and an elliptical cross section along the direction of the linear arrangement of the recesses 42 in the print circuit board 41. One of the light emitting elements 43 is disposed on the flat bottom 45 of each of the recesses 42 in order that a linear light source is formed of the light emitting elements 43. The linear light source is parallel to a linear array of photosensors. One of the emission-permeable window part 44 is disposed in each of the recesses 42 above the light emitting element 43 placed therein. The light emitting element 43 can be a light emitting diode, such as white light emitting diode, red light emitting diode, green light emitting diode and blue light emitting diode. The emission-permeable window part 44 can be a transparent plastic sealing, for example an epoxy resin.

Referring to FIG. 4A, the package of the light emitting element 43 has a structure of truncated elliptical cone, the light emitting element 43 provides an elliptical illumination area outward from the print circuit board 41. The long axis of the elliptical illumination area is along the linear arrangement of the light emitting elements 43, and the short axis of the elliptical illumination area is perpendicular to the linear arrangement of the light emitting elements 43. Thus, the maximum illumination angle $\theta_1$ of the light emitting element 43 along the long axis of the elliptical illumination area is larger than the maximum illumination angle $\theta_2$ of the light emitting element 43 along the short axis of the elliptical illumination area, as shown in FIG. 4B and FIG. 4C. Therefore, the luminance flux of each of the light emitting elements 43 is concentrated on the direction of the long axis of the elliptical illumination area, and the luminance flux of the light emitting element 43 along this direction is improved. The light source device 40 formed of the light emitting elements 43 of the first embodiment provides a linear light source with an elongated illumination area parallel to the linear array of photosensors. Since the luminance flux of each of the light emitting elements 43 along the linear array of photosensors is improved, the light source device 40 can use less number of the light emitting elements 43 and still satisfy the required illumination. The cost down for manufacturing the light source device 40 thus can be obtained.

Figure 5A:
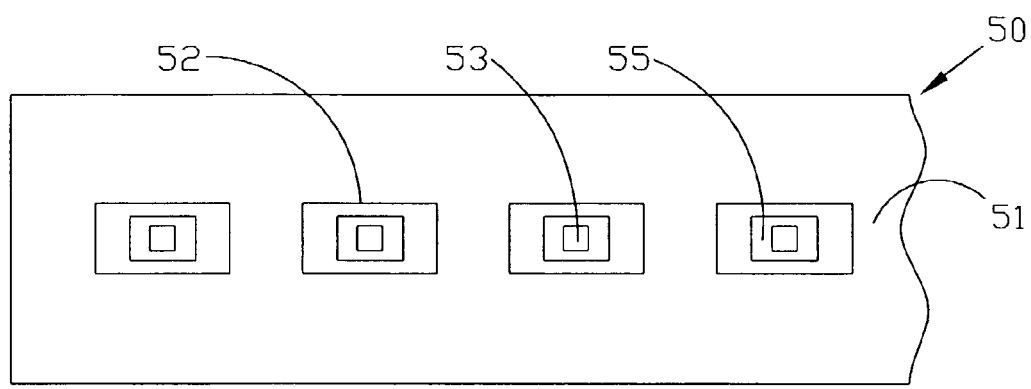
FIG. 5A is a schematic top view of another light source device according to a second embodiment of the present invention.
Figure 5B:
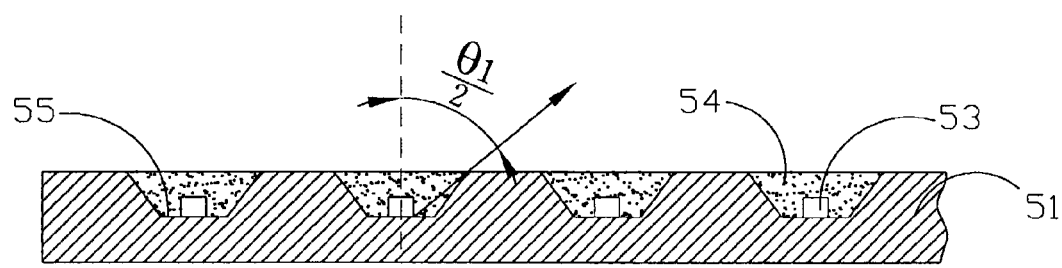
FIG. 5B is a schematic cross section view of the light source device of FIG. 5A along the longitudinal direction thereof.
Figure 5C:
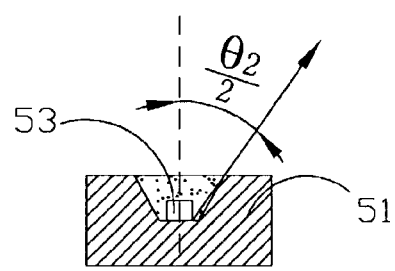
FIG. 5C is a schematic cross section view of the light source device of FIG. 5A along the transverse direction thereof.

FIG. 5A to FIG. 5C show a light source device 50 according to a second embodiment of the present invention.

The light source device 50 includes a print circuit board 51 having a plurality of recesses 52 formed of truncated elliptical cones in a linear arrangement formed thereon, a plurality of light emitting elements 53 and emission-permeable window parts 54. Each of the recesses 52 has a flat bottom 55 and an elliptical cross section along the direction of the linear arrangement of the recesses 52 in the print circuit board 51. One of the light emitting elements 53 is disposed on the flat bottom 55 of each of the recesses 52 in order that a linear light source is formed of the light emitting elements 53. The linear light source is parallel to a linear array of photosensors. One of the emission-permeable window part 54 is disposed in each of the recesses 52 above the light emitting element 53 placed therein. The light emitting element 53 can be a light emitting diode, such as white light emitting diode, red light emitting diode, green light emitting diode and blue light emitting diode. The emission-permeable window part 54 can be a transparent plastic sealing, for example an epoxy resin.

Referring to FIG. 5A, the package of the light emitting element 53 has a structure of truncated rectangular cone, the light emitting element 53 provides a rectangular illumination area outward from the print circuit board 51. The long dimension of the rectangular illumination area is along the linear arrangement of the light emitting elements 53, and the short dimension of the rectangular illumination area is perpendicular to the linear arrangement of the light emitting elements 53. Thus, the maximum illumination angle $\theta_1$ of the light emitting element 53 along the long dimension of the rectangular illumination area is larger than the maximum illumination angle $\theta_2$ of the light emitting element 53 along the short dimension of the rectangular illumination area, as shown in FIG. 5B and FIG. 5C. Therefore, the luminance flux of each of the light emitting elements 53 is concentrated on the direction of the long dimension of the rectangular illumination area, and the luminance flux of the light emitting element 53 along this direction is improved. The light source device 50 formed of the light emitting elements 53 of the second embodiment provides a linear light source with an elongated illumination area parallel to the linear array of photosensors. Since the luminance flux of each of the light emitting elements 53 along the linear array of photosensors is improved, the light source device 50 can use less number of the light emitting elements 53 and still satisfy the required illumination. The cost down for manufacturing the light source device 50 thus can be obtained.

The embodiments are only used to illustrate the present invention, not intended to limit the scope thereof. Many modifications of the embodiments can be made without departing from the spirit of the present invention.

What is claimed is:

1. A light source device, comprising:
   a printed circuit board having a plurality of recesses formed of truncated elliptical cones in a linear arrangement formed thereon, at least one of said recesses having a flat bottom and an elliptical cross section along the direction of the linear arrangement of said recesses in said printed circuit board;
   a plurality of light emitting elements, at least one of said light emitting elements being disposed on said flat bottom of an associated one of said recesses; and
   an emission-permeable window disposed in said associated one of said recesses above said at least one of said light emitting elements including a transparent seal comprising a substantially planar outer surface.

2. The light source device of claim 1, wherein said at least one of said light emitting elements includes a light emitting diode.

3. The light source device of claim 2, wherein said light emitting diode is selected from a group consisting of white light emitting diode, red light emitting diode, green light emitting diode and blue light emitting diode.

4. The light source device of claim 1, wherein said emission permeable window includes epoxy resin.

5. A light source device, comprising:
   a printed circuit board having a plurality of recesses formed of elongated rectangular cones in a linear arrangement formed thereon, at least one of said recesses having a flat bottom and a rectangular cross-section along the direction of the linear arrangement of said recesses in said printed circuit board;
   a plurality of light emitting elements, at least one of said light emitting elements being disposed on said flat bottom of an associated one of said recesses; and
   an emission-permeable window disposed in said associated one of said recesses above said at least one of said light emitting elements including a transparent seal.

6. The light source device of claim 5, wherein said at least one of said light emitting elements includes a light emitting diode.

7. The light source device of claim 6, wherein said light emitting diode is selected from a group consisting of white light emitting diode, red light emitting diode, green light emitting diode and blue light emitting diode.

8. The light source device of claim 5, wherein said emission-permeable window includes epoxy resin.

* * * * *